(12) United States Patent
Shih

(10) Patent No.: US 10,277,108 B1
(45) Date of Patent: Apr. 30, 2019

(54) POWER CONVERTER SUITABLE FOR POWER ELEMENTS OF DIFFERENT SIZES

(71) Applicants: LITE-ON ELECTRONICS (GUANGZHOU) LIMITED, Guangzhou (CN); LITE-ON TECHNOLOGY CORPORATION, Taipei (TW)

(72) Inventor: Yi-An Shih, Taipei (TW)

(73) Assignees: LITE-ON ELECTRONICS (GUANGZHOU) LIMITED (CN); LITE-ON TECHNOLOGY CORPORATION (TW)

( * ) Notice: Subject to any disclaimer, the term of this patent is extended or adjusted under 35 U.S.C. 154(b) by 0 days.

(21) Appl. No.: 16/037,722

(22) Filed: Jul. 17, 2018

(30) Foreign Application Priority Data

May 17, 2018 (CN) .......................... 2018 1 0472703

(51) Int. Cl.
*H05K 7/20* (2006.01)
*H02M 1/10* (2006.01)
*H02M 7/00* (2006.01)

(52) U.S. Cl.
CPC ............. *H02M 1/10* (2013.01); *H02M 7/003* (2013.01); *H05K 7/209* (2013.01); *H05K 7/20163* (2013.01); *H05K 7/20909* (2013.01)

(58) Field of Classification Search
CPC ........ H05K 7/20163; H05K 7/20909–7/20918
See application file for complete search history.

(56) References Cited

U.S. PATENT DOCUMENTS

| 2003/0206392 | A1* | 11/2003 | Kawata | ................ | H05K 1/0203 361/631 |
| 2013/0308275 | A1* | 11/2013 | Yamanaka | ........... | H05K 7/2039 361/717 |

FOREIGN PATENT DOCUMENTS

| CN | 104303412 A | 1/2015 |
| TW | 201505329 A | 2/2015 |

\* cited by examiner

*Primary Examiner* — Fred E Finch, III
*Assistant Examiner* — Ishrat F Jamali
(74) *Attorney, Agent, or Firm* — Innovation Counsel LLP

(57) ABSTRACT

A power converter suitable for power elements of different sizes including a base, a heat sink, a circuit board and a power element is provided. The base has a partition and an opening. The partition has a first step surface and a second step surface. The first step surface and the second step surface are located at different levels. The heat sink is mounted on the base and leans against one of the first step surface and the second step surface of the partition. The circuit board is assembled on the base. The power element is disposed on the circuit board and contacts the heat sink through the opening.

7 Claims, 12 Drawing Sheets

POWER CONVERTER SUITABLE FOR POWER ELEMENTS OF DIFFERENT SIZES

This application claims the benefit of People's Republic of China application Serial No. 201810472703.2, filed May 17, 2018, the subject matter of which is incorporated herein by reference.

BACKGROUND OF THE INVENTION

Field of the Invention

The invention relates in general to a power converter, and more particularly to a power converter suitable for power elements of different sizes.

Description of the Related Art

The power converter has been widely used in various electronic products such as power supply, computer, uninterrupted power system (UPS), and AC to DC converter. The main function of the power converter, which provides a stable constant voltage or constant current, is for converting the power at the input end to the power necessary for the load at the output end. Generally, the power converter includes a power element (such as a power transistor and a power diode) and a dissipation device (such as a heat sink and a fan). Currently, the power elements of different sizes or different output powers are available in the market. To work with the power elements of different sizes or different output powers, the heat sinks and fans of corresponding sizes or corresponding dissipation efficiencies are provided to avoid the power converters being suspended, broken or damaged due to overheat.

In the power converter, the power element and the heat sink are assembled on the base, and the structure of the base is only suitable for the power element of a particular size and its corresponding heat sink. In other words, in order to fix the power element and the heat sink in the base, once the sizes of the power element and the heat sink are decided, the structure and mold of the base corresponding to the decided size are designed. If the sizes of the power element and the heat sink are to be changed, a new mold needs to be developed such that a new base can be provided. However, the mold cost will be increased.

SUMMARY OF THE INVENTION

The invention is directed to a power converter suitable for power elements of different sizes to share the base and reduce the mold quantity and cost.

According to one embodiment of the invention, a power converter suitable for power elements of different sizes including a base, a heat sink, a circuit board and a power element is provided. The base has a partition and an opening. The partition has a first step surface and a second step surface. The first step surface and the second step surface are located at different levels. The heat sink is mounted on the base and leans against one of the first step surface and the second step surface of the partition. The circuit board is assembled on the base. The power element is disposed on the circuit board and contacts the heat sink through the opening.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of the invention are disclosed below with a number of embodiments. However, the disclosed embodiments are for explanatory and exemplary purposes only, not for limiting the scope of protection of the invention. Similar/identical designations are used to indicate similar/identical elements.

Figure 1A:
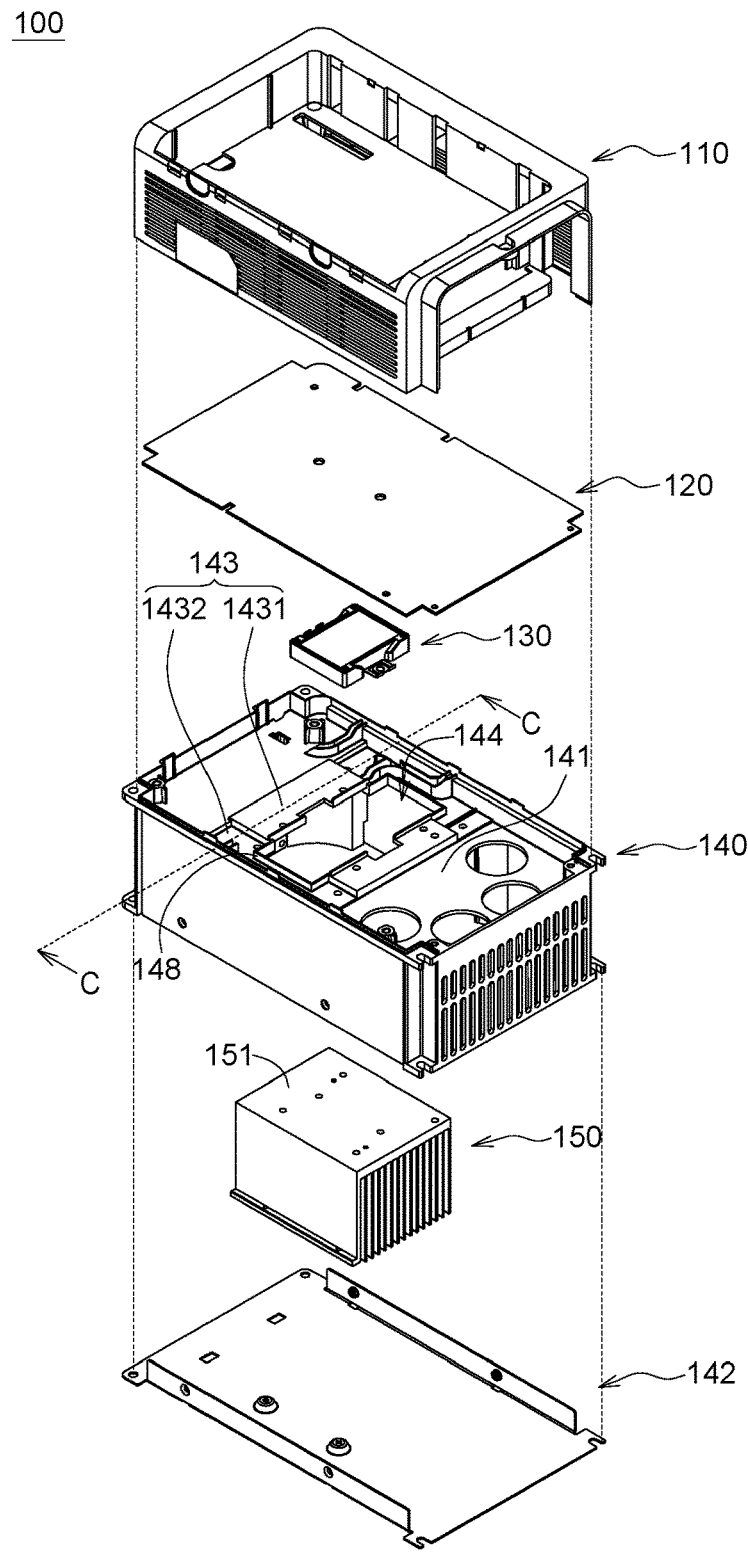
FIGS. 1A and 1B are explosion diagrams of a power converter suitable for power elements of different sizes in a top view and a bottom view respectively according to an embodiment of the invention.
Figure 1B:
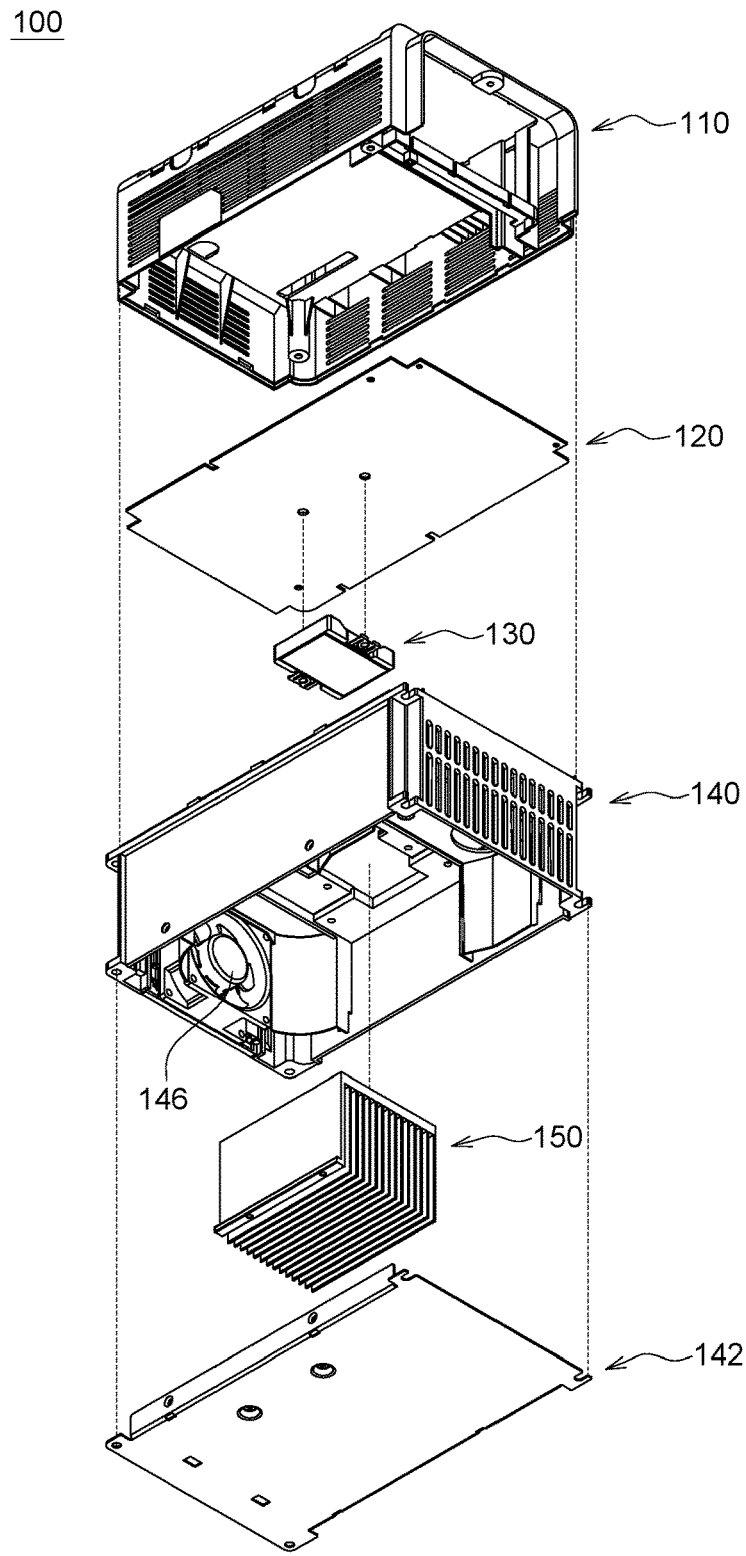

Refer to FIGS. 1A and 1B. The power converter 100 according to an embodiment of the invention includes an upper cover 110, a circuit board 120, a power element 130, a base 140, a base plate 142 and a heat sink 150. The power element 130 is disposed on the circuit board 12. The upper cover 110, the circuit board 120, the base plate 142 and the heat sink 150 respectively are assembled on the base 140. Besides, the arrangement that the upper cover 110 and the circuit board 120 cover the base 140 is an exemplification only, not for limiting the invention.

In the embodiments of the invention, the base 140 has a partition 141, which has an opening 144 and multiple step surfaces 143. The heat sink 150 leans against one of the multiple step surface 143 of the partition 141. The power element 130 contacts the heat sink 150 through the opening 144. In the embodiments of the invention, no matter what size the power element 130 is, the circuit board 120 is assembled to a fixing position of the base 140. That is, the circuit board 120 is assembled at the same position of the base 140.

Figure 1C:
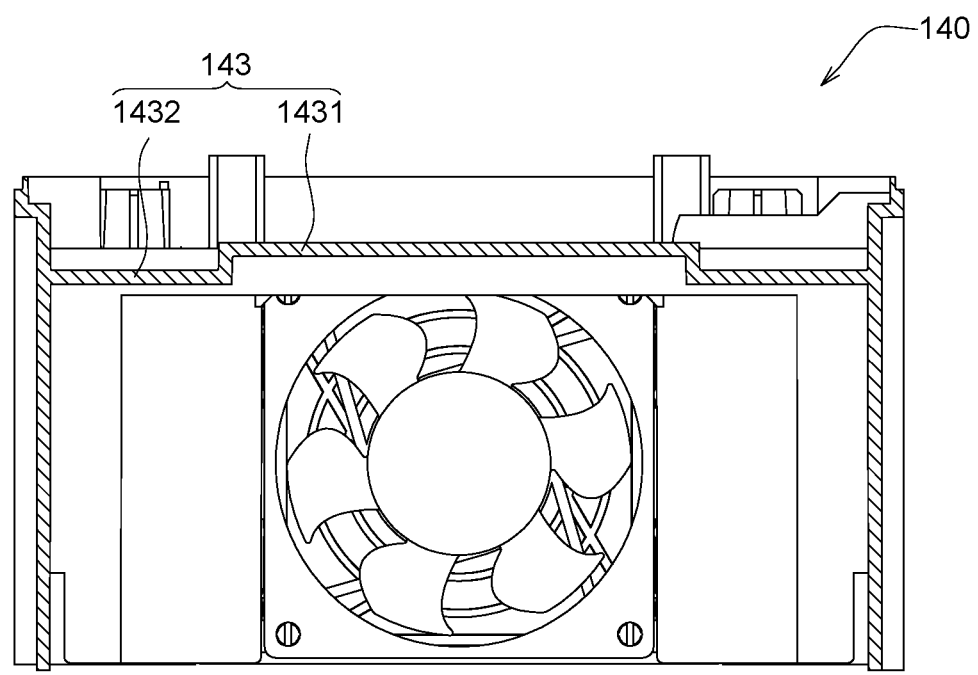
FIG. 1C is a cross-sectional view of a base along a cross-sectional line C-C.

Refer to FIG. 1A and FIG. 1C in which two step surfaces are used as an example. The partition 141 has a first step surface 1431 and a second step surface 1432. The first step surface 1431 and the second step surface 1432 are located at different levels. The heat sink 150 decides to lean against the first step surface 1431 or the second step surface 1432 of the partition 141 according to the size of the power element.

Figure 2A:
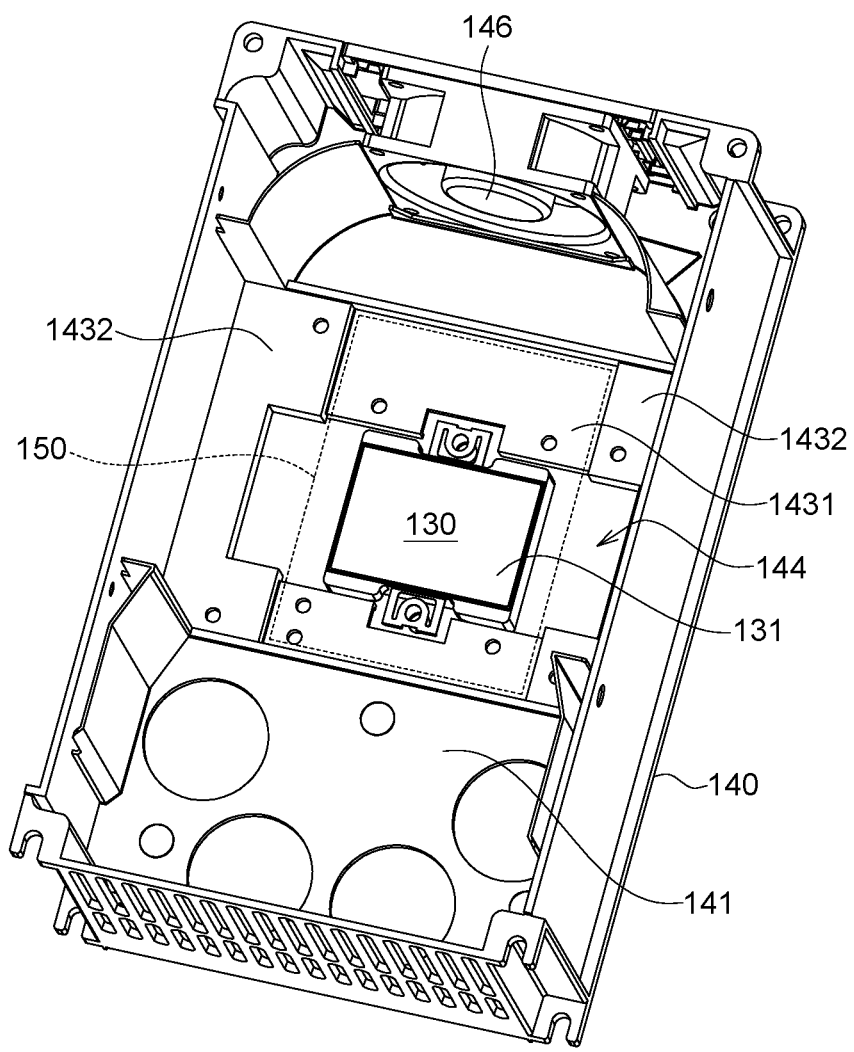
FIG. 2A is a schematic diagram of a first size power element mounted on a base.
Figure 2B:
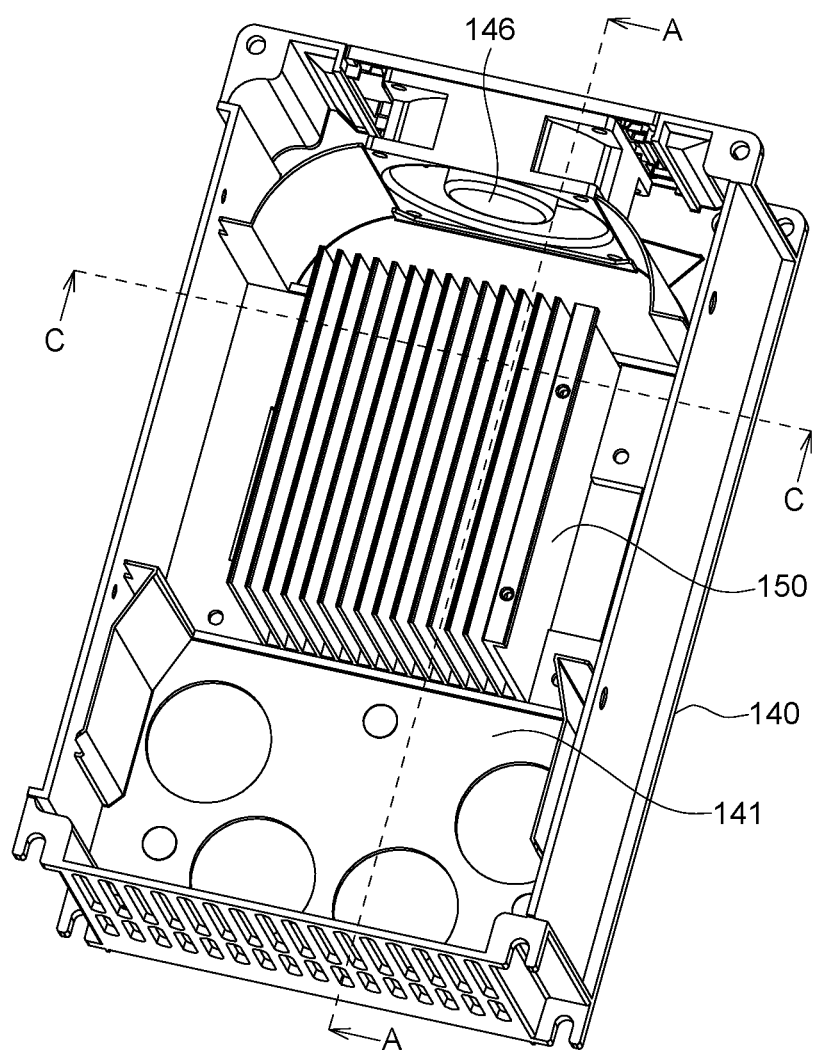
FIG. 2B is a schematic diagram of a first size heat sink mounted on a base.

Referring to FIGS. 2A and 2B, schematic diagrams of a first size power element 130 and a corresponding first size heat sink 150 mounted on a base 140 of the power converter 100 according to the embodiment of the invention are respectively shown. When the power element 130 is a first size, the heat sink 150 leans against the first step surface 1431 of the partition 141 as indicated in the dotted lines of FIG. 2A. Referring to FIG. 2D, a cross-sectional view of FIG. 2B along a cross-sectional line C-C is shown. When the power element 130 is the first size, the heat sink 150 leans against the first step surface 1431 of the partition 141.

Figure 2C:
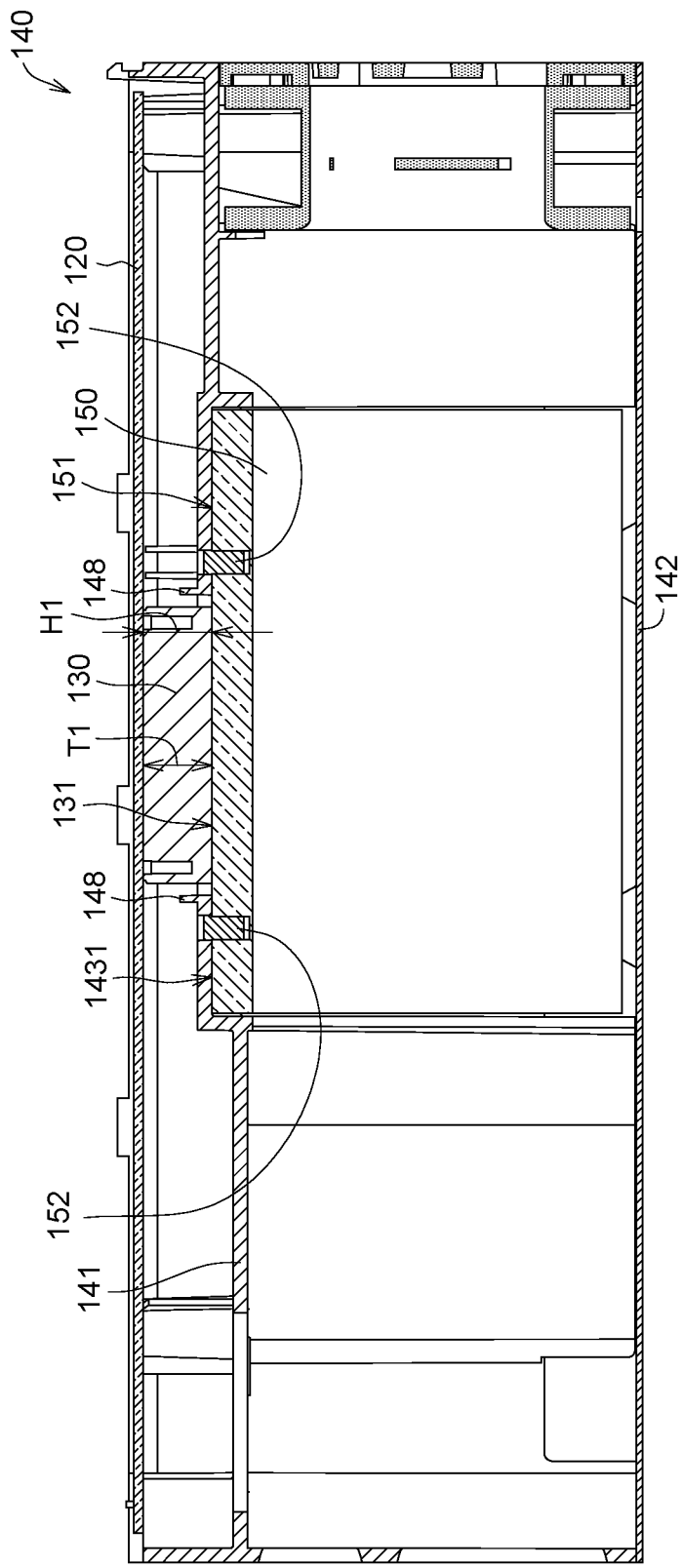
FIG. 2C is a cross-sectional view of the first size heat sink of FIG. 2B mounted on the base along a cross-sectional line A-A.
Figure 2D:
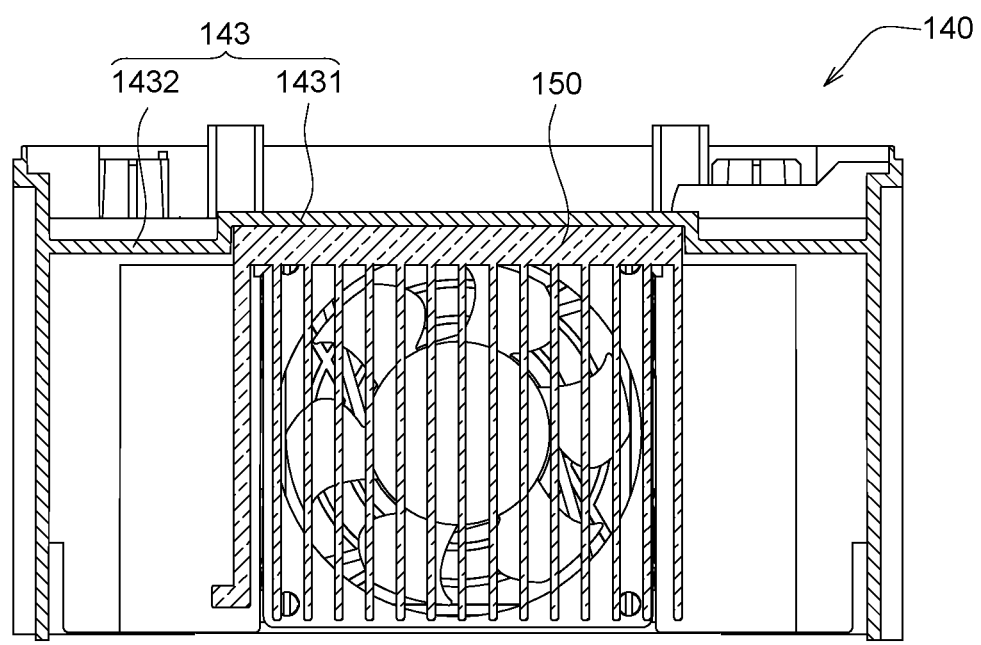
FIG. 2D is a cross-sectional view of FIG. 2B along a cross-sectional line C-C.

Referring to FIG. 2C, a cross-sectional view of the first size heat sink 150 of FIG. 2B mounted on the base 140 along a cross-sectional line A-A is shown. The heat sink 150 is disposed between the partition 141 and the base plate 142. The upper surface 151 of the heat sink 150 can be fixed on the first step surface 1431 of the partition 141 through multiple first fixing elements 152 (such as screws), such that the heat sink 150 can be fixed on the base 140. The upper surface 151 of the heat sink 150 leans against the first step surface 1431 of the partition 141.

In an embodiment, the upper surface 151 of the heat sink 150 can directly contact the lower surface 131 of the first size power element 130 through a thermally conductive adhesive to absorb the waste heat generated by the first size power element 130. The first size power element 130 can be directly attached on the heat sink 150 through the opening 144, such that the heat can be dissipated through a short and effective dissipation path. Also, the base plate 142 can contact the bottom of the heat sink 150 to increase the dissipation area. The heat sink 150 can be formed by dissipation fins. To increase the dissipation efficiency, an active dissipation element 146 (see FIG. 2B), such as a fan, can be disposed in the base 140. The airflow generated by the fan can take away the heat absorbed by the dissipation fins and achieve a cooling effect.

Refer to FIG. 2C. In the present embodiment, the first size power element 130 has a first thickness T1, and the first step surface 1431 of the partition 141 is located at a first level. The first step surface 1431 of the partition 141 has a first distance H1 with respect to the circuit board 120 mounted on the base 140. The first distance H1 is equivalent to the first thickness T1.

Figure 3A:
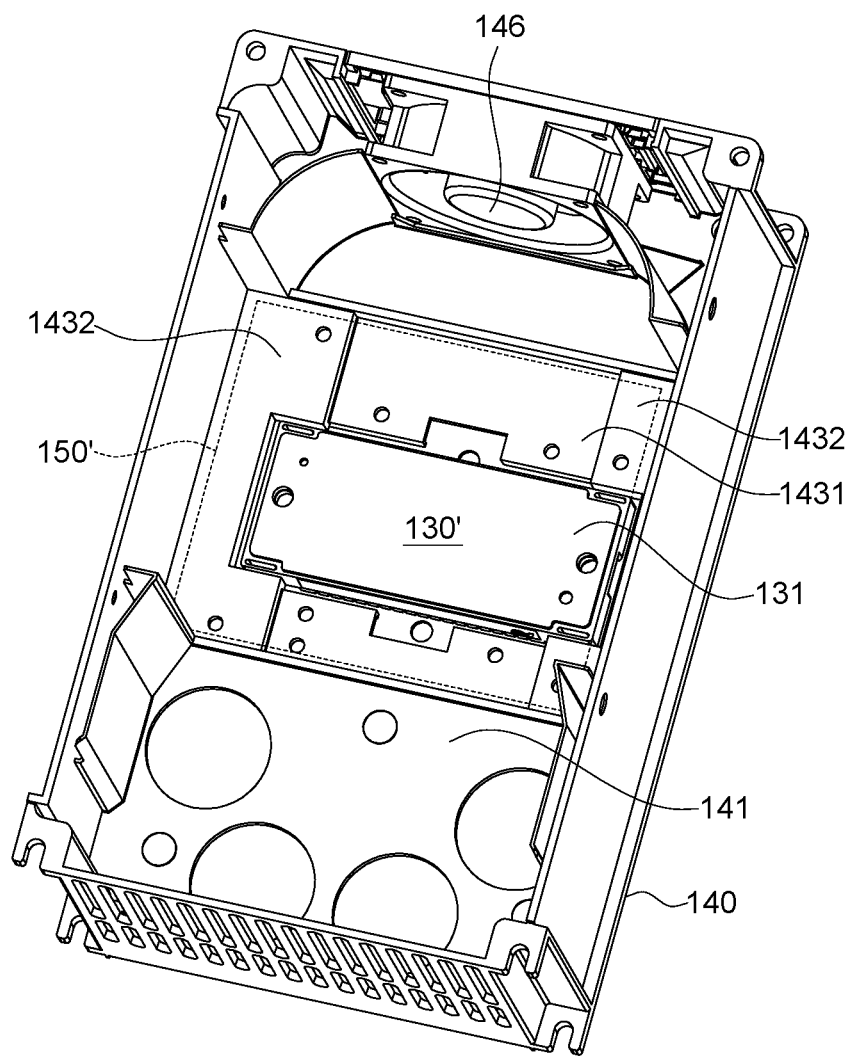
FIG. 3A is a schematic diagram of a second size power element mounted on a base.
Figure 3B:
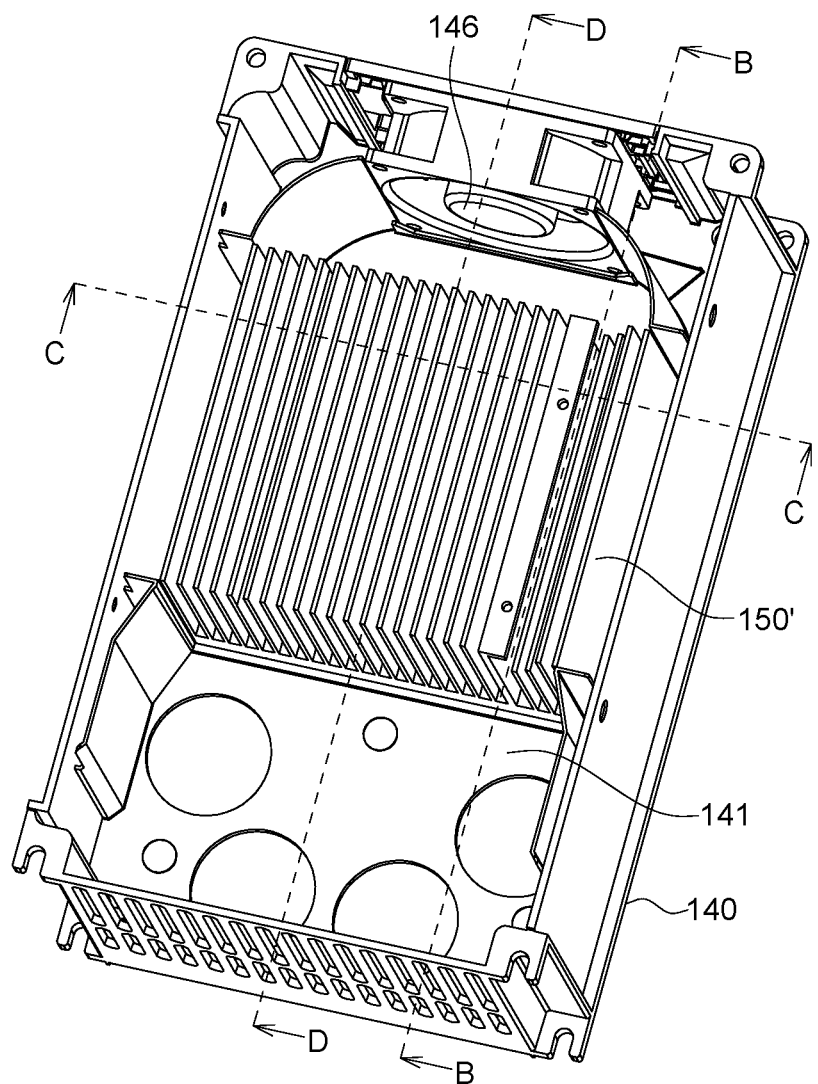
FIG. 3B is a schematic diagram of a second size heat sink mounted on a base.

Referring to FIGS. 3A and 3B, schematic diagrams of a second size power element 130' and a corresponding second size heat sink 150' mounted on a base 140 of the power converter 100 according to the embodiment of the invention are respectively shown. When the power element 130' is a second size, the heat sink 150' leans against the second step surface 1432 of the partition 141 as indicated in the dotted lines of FIG. 3A. The first size is different from the second size. That is, the power element 130' has a second thickness T2 different from the first thickness T1 of the power element 130. Referring to FIG. 3D, a cross-sectional view of FIG. 3B along a cross-sectional line C-C is shown. When the power element 130' is the second size, the heat sink 150' leans against the second step surface 1432 of the partition 141.

Figure 3C:
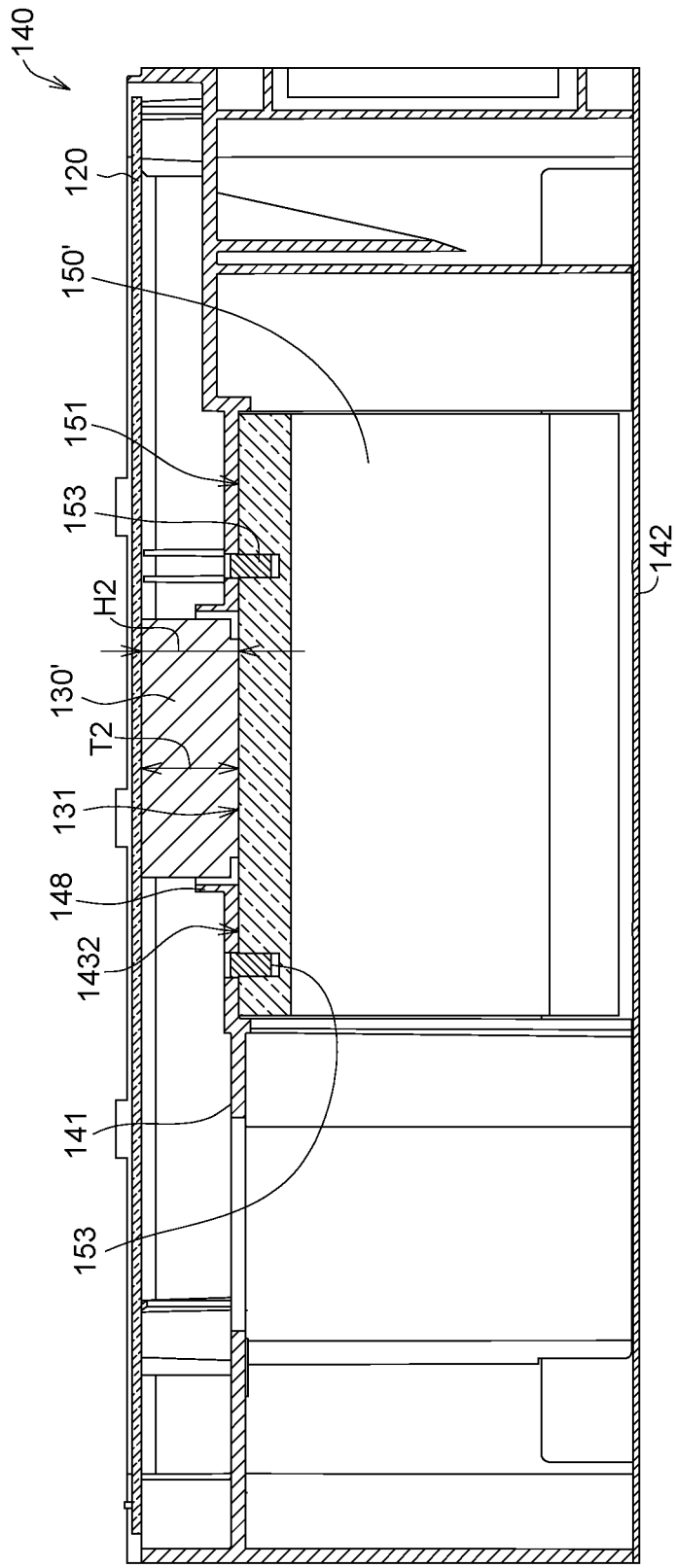
FIG. 3C is a cross-sectional view of the second size heat sink of FIG. 3B mounted on the base along a cross-sectional line B-B.
Figure 3D:
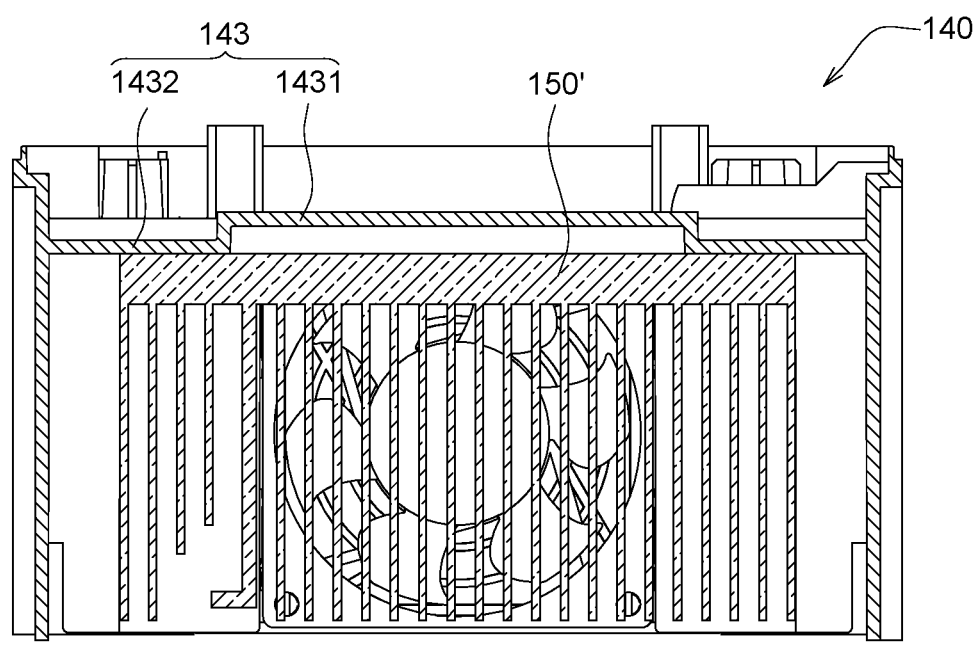
FIG. 3D is a cross-sectional view of FIG. 3B along a cross-sectional line C-C.

Referring to FIG. 3C, a cross-sectional view of the second size heat sink 150' of FIG. 3B mounted on the base 140 along a cross-sectional line B-B is shown. The heat sink 150' is disposed between the partition 141 and the base plate 142. The upper surface 151 of the heat sink 150' can be fixed on the second step surface 1432 of the partition 141 through multiple second fixing elements 153 (such as screws), such that the heat sink 150' can be fixed on the base 140. The upper surface 151 of the heat sink 150' leans against the second step surface 1432 of the partition 141.

FIG. 3C is different from FIG. 2C in that: the second size power element 130' has the second thickness T2, and the heat sink 150' leans against the second step surface 1432 of the partition 141 wherein the second step surface 1432 of the partition 141 is located at a second level. The second step surface 1432 of the partition 141 has a second distance H2 with respect to the circuit board 120 mounted on the base 140. The second distance H2 is different from the first distance H1 of the first step surface 1431 of the partition 141 with respect to the circuit board 120 mounted on the base 140. The second distance H2 is equivalent to the second thickness T2.

In the two embodiments disclosed above, the first size power element 130 can be a power element by Easy Pack and has a thickness T1 of 12 mm, the second size power element 130' can be a power element by Econo Pack and has a thickness T2 of 17 mm (larger than the thickness T1 of the first size power element 130). The power elements 130 and 130' are disposed on the circuit board 120. The circuit board 120 is assembled to a fixing position of the base 140. Therefore, when the power elements 130 and 130' of different thicknesses are assembled on the base 140 through the circuit board 120, the lower surfaces of the power elements 130 and 130' will be located at different levels as indicated in FIG. 2C and FIG. 3C.

For achieving the object of sharing the base 140, two step surfaces 1431 and 1432 of different levels corresponding to the power elements 130 and 130' of different thicknesses are provided in the embodiments of the invention. The heat sinks 150 and 150' respectively lean against corresponding step surfaces 1431 and 1432, such that the power elements 130 and 130' can directly contact the heat sink through the opening 144 to dissipate the heat. Thus, there is no need to provide different bases 140 in response to different sizes of the power elements 130 and 130', the base 140 can be shared and the mold quantity and cost can be reduced.

In the above embodiments, two step surfaces are used as an exemplification, but the invention is not limited thereto. For example, a corresponding quantity of step surfaces can be designed according to the number of sizes of the power elements. For example, when the power element has four different sizes, the base 140 can have four step surfaces located at four different levels respectively.

Figure 4:
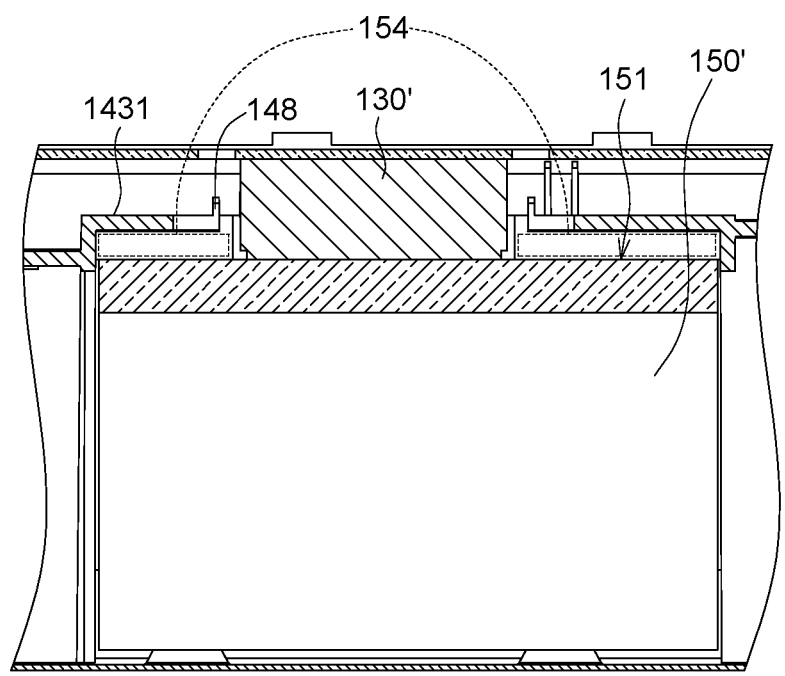
FIG. 4 is a cross-sectional view of the second size heat sink of FIG. 3B mounted on the base along a cross-sectional line D-D.

Refer to FIG. 1A and FIG. 4. FIG. 4 is a cross-sectional view of the second size heat sink 150' of FIG. 3B mounted on the base 140 along a cross-sectional line D-D. In an embodiment, the partition 141 includes multiple protection walls 148, disposed surrounding the opening 144 and protruded towards the circuit board 120, such that when the circuit board 120 is mounted above the partition 141 on the base 140, the protection walls 148 can be located in the gap between the circuit board 120 and the partition 141. In an embodiment, in order to pass the parts destruction experiment, an explosion-proof plate is added to the power element to prevent spark splattering. However, if the explosion energy is too strong, the explosion-proof film may not resist the explosion and fails to protect the power element. Apart from having a number of protection walls 148 disposed surrounding the opening 144 to block spark splattering, the base 140 of the present embodiment further has a number of step surfaces 143 disposed surrounding the opening 144 for venting the explosion energy to a safety buffer zone 154 (such as located between the first step surface 1431 and the upper surface 151 of the heat sink 150' as indicated in FIG. 4), not only decreasing the explosion energy but also reducing the risk of the explosion-proof plate being ruptured.

To comply with relevant safety regulations regarding the creepage distance and the space distance for the electronic elements on the circuit board 120 and the heat sinks 150 and 150', the base 140 of the present embodiment has multiple step surfaces 143 disposed surrounding the opening 144 to increase the space distance and the creepage distance. For example, wires can be disposed on the sidewall of the safety buffer zone 154 of FIG. 4. Furthermore, when the wiring space of the circuit board 120 is effectively used, the volume of the circuit board 120 will be reduced.

A power converter suitable for power elements of different sizes is disclosed in above embodiments of the invention. The power converter of the invention can be used in power elements of different sizes and thicknesses without changing the design of the base, and therefore satisfies market demands and increase competitiveness. That is, the heat sink decides whether to lean against the first step surface or the second step surface of the partition according to the size of the power element. Additionally, the power converter of the invention can be used in power elements of different sizes and thicknesses without changing the design of the base, neither increasing the mold quantity, manufacturing difficulty and manufacturing cost of the base nor increasing assembly difficulty, such that the base can be shared and the mold quantity and cost can be reduced.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A power converter suitable for power elements of different sizes, comprising:
    a base having a partition and an opening, wherein the partition has a first step surface and a second step surface located at different levels;
    a heat sink mounted on the base and leaning against one of the first step surface and the second step surface of the partition;
    a circuit board mounted on the base; and
    a power element disposed on the circuit board and contacting the heat sink through the opening,
    wherein when the power element is a first size, the heat sink leans against the first step surface of the partition, when the power element is a second size, the heat sink leans against the second step surface of the partition, and the first size is different from the second size.

2. The power converter according to claim 1, wherein the heat sink leans against the first step surface or the second step surface of the partition according to the size of the power element.

3. The power converter according to claim 1, wherein the size of the power element comprises a first thickness or a second thickness different from the first thickness, the first step surface has a first distance with respect to the circuit board, the first distance corresponds to the first thickness, the second step surface has a second distance with respect to the circuit board, the second distance corresponds to the second thickness, and the first distance is different from the second distance.

4. The power converter according to claim 3, wherein the first step surface has a first distance with respect to the circuit board, the second step surface has a second distance with respect to the circuit board, and the first distance is different from the second distance.

5. The power converter according to claim 3, further comprising a plurality of fixing elements used for fixing the heat sink on the partition.

6. The power converter according to claim 3, wherein when the power element is a first size, the circuit board is assembled to a fixing position of the base, when the power element is a second size, the circuit board is assembled to the fixing position on the base, and the first size is different from the second size.

7. The power converter according to claim 3, wherein the partition further comprises a plurality of protection walls disposed surrounding the opening and located in a gap between the circuit board and the partition.

* * * * *